(12) United States Patent
Shiu et al.

(10) Patent No.: US 10,998,420 B2
(45) Date of Patent: May 4, 2021

(54) DIRECT GROWTH OF LATERAL III-V BIPOLAR TRANSISTOR ON SILICON SUBSTRATE

(71) Applicant: INTERNATIONAL BUSINESS MACHINES CORPORATION, Armonk, NY (US)

(72) Inventors: Kuen-Ting Shiu, Yorktown Heights, NY (US); Tak H. Ning, Yorktown Heights, NY (US); Jeng-Bang Yau, Yorktown Heights, NY (US); Cheng-Wei Cheng, White Plains, NY (US); Ko-Tao Lee, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 58 days.

(21) Appl. No.: 15/945,305

(22) Filed: Apr. 4, 2018

(65) Prior Publication Data
US 2019/0312126 A1    Oct. 10, 2019

(51) Int. Cl.
| | | |
|---|---|---|
| *H01L 29/66* | (2006.01) |
| *H01L 29/737* | (2006.01) |
| *H01L 21/308* | (2006.01) |
| *H01L 29/06* | (2006.01) |
| *H01L 21/306* | (2006.01) |
| *H01L 29/205* | (2006.01) |

(52) U.S. Cl.
CPC ...... *H01L 29/66318* (2013.01); *H01L 21/308* (2013.01); *H01L 21/30621* (2013.01); *H01L 29/0649* (2013.01); *H01L 29/205* (2013.01); *H01L 29/737* (2013.01)

(58) Field of Classification Search
CPC .................................................. H01L 29/66318
See application file for complete search history.

(56) References Cited

U.S. PATENT DOCUMENTS

| | | |
|---|---|---|
| 8,557,670 B1 | 10/2013 | Cai et al. |
| 9,059,016 B1 | 6/2015 | Hekmatshoar-Tabari et al. |
| 9,059,232 B2 | 6/2015 | Cheng et al. |
| 9,209,095 B2 | 12/2015 | Chang et al. |
| 9,318,585 B1 | 4/2016 | Cai et al. |

(Continued)

OTHER PUBLICATIONS

Ning, T.H. et al., "On the Performance and Scaling of Symmetric Lateral Bipolar Transistors on SOI" IEEE Journal of the Electron Devices Society (Jan. 2013) pp. 21-27, vol. 1, No. 1.

(Continued)

*Primary Examiner* — Lex H Malsawma
*Assistant Examiner* — Laura M Dykes
(74) *Attorney, Agent, or Firm* — Tutunjian & Bitetto, P.C.; Robert Sullivan

(57) ABSTRACT

A lateral bipolar junction transistor including an emitter region, base region and collector region laterally orientated over a type IV semiconductor substrate, each of the emitter region, the base region and the collector region being composed of a type III-V semiconductor material. A buried oxide layer is present between the type IV semiconductor substrate and the emitter region, the base region and the collector region. The buried oxide layer having a pedestal aligned with the base region.

5 Claims, 5 Drawing Sheets

(56) References Cited

U.S. PATENT DOCUMENTS

| | | | |
|---|---|---|---|
| 9,331,097 B2 | 5/2016 | Cai et al. | |
| 9,673,307 B1 | 6/2017 | Chan et al. | |
| 9,748,369 B2 | 8/2017 | Liu | |
| 2004/0238843 A1* | 12/2004 | Sawdai | H01L 29/66318 257/197 |
| 2012/0139009 A1* | 6/2012 | Ning | H01L 29/7317 257/197 |
| 2015/0102348 A1* | 4/2015 | Cai | H01L 29/785 257/69 |
| 2016/0293736 A1* | 10/2016 | Cheng | H01L 21/02178 |
| 2016/0300935 A1* | 10/2016 | Cai | H01L 27/1203 |
| 2018/0019330 A1* | 1/2018 | Balakrishnan | H01L 29/737 |

OTHER PUBLICATIONS

Ning, T.H., "A Perspective on SOI Symmetric Lateral Bipolar Transistors for Ultra-Low-Power Systems" Journal of the Electron Devices Society (Sep. 2016) pp. 227-235, vol. 4, No. 5.

\* cited by examiner

DIRECT GROWTH OF LATERAL III-V BIPOLAR TRANSISTOR ON SILICON SUBSTRATE

BACKGROUND

Technical Field

The present disclosure relates to a bipolar junction transistor (BJT) structure, and more particularly to lateral bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, a lateral bipolar junction transistor is provided including an emitter region, base region and collector region laterally orientated over a type IV semiconductor substrate, each of the emitter region, the base region and the collector region being composed of a type III-V semiconductor material, wherein a buried oxide layer is present between the type IV semiconductor substrate and the emitter region, the base region and the collector region, the buried oxide layer having a pedestal aligned with the base region.

In another aspect, a method of forming a lateral bipolar junction transistor is provided that includes forming a fin structure from a type IV semiconductor on insulator layer that is present over a buried dielectric layer, wherein the buried dielectric layer is present on a type IV base substrate layer. A first type III-V semiconductor material layer is epitaxially grown on sidewalls of the fin structure from the type IV semiconductor on insulator layer. The first type III-V semiconductor material layer is patterned into a base region atop a pedestal of the buried dielectric layer. At least a second type III-V semiconductor material is epitaxially formed on sidewalls of the base region, wherein a first portion of the at least the second type III-V semiconductor material provides an emitter region, and a second portion of the at least the second type III-V semiconductor material provides a collector region.

In another embodiment, the method of forming the lateral bipolar junction transistor is provided that includes first patterning a fin structure from a type IV semiconductor on insulator layer that is present over a buried dielectric layer, the buried dielectric layer is present on a type IV base substrate layer, wherein a first mask for patterning the fin structure provides fins having a length extending in a first direction along a trench. A first type III-V semiconductor material layer is epitaxially grown on sidewalls of the fin structure from the type IV semiconductor on insulator layer. The method may continue with second patterning the first type III-V semiconductor material layer into a base region atop a pedestal of the buried dielectric layer, wherein a second mask for patterning the base region extends along a second direction that is perpendicular to the first direction and is across the trench. At least a second type III-V semiconductor material is epitaxially formed on sidewalls of the base region, wherein a first portion of the at least the second type III-V semiconductor material provides an emitter region, and a second portion of the at least the second type III-V semiconductor material provides a collector region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
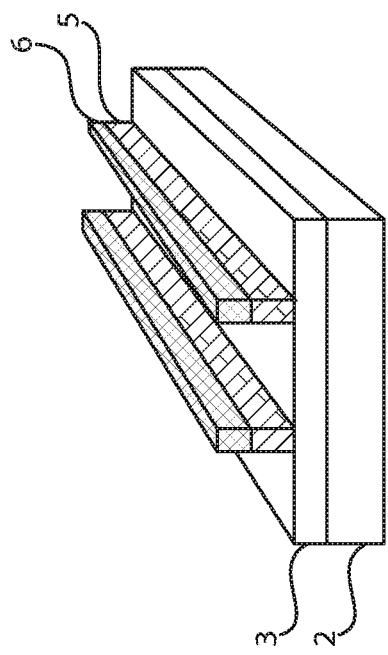
FIG. 1 is a perspective view of a semiconductor on insulator layer substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed.

The present disclosure provides lateral bipolar junction transistors (LBJT), and methods of forming lateral bipolar junction transistor (LBJT) devices including type III-V semiconductor materials for the emitter region, base region and collector region of the devices. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. In contrast to type III-V semiconductor materials, by "type IV semiconductor" it is meant that the semiconductor material includes at least one element from Group IVA (i.e., Group 14) of the Periodic Table of Elements.

The present disclosure provides lateral bipolar junction transistors (LBJT), and methods of forming LBJT devices including III-V semiconductor materials. III-V semiconductor materials are great candidates for lateral bipolar junction transistors and can offer high cut off frequency ($f_{max}$) for both NPN and PNP types. Additionally, in some applications a high voltage LBJT device is required for high voltage and high speed applications. The $f_{max}$ of silicon-based BJT can be larger than 1 THz. Therefore, BJT is a better choice for high-speed application than the CMOS counterparts. Lateral BJT (LBJT) is similar to CMOS in layout and scaling, and therefore offers large area reduction. In comparison to silicon (Si) or silicon germanium (SiGe), type III-V semiconductor materials can offer smaller bandgap at base and larger bandgap at collector. The former gives higher gain while the latter provides larger breakdown voltage. The methods and structures described herein provides both the structure and process to implement III-V LBJT device on SOI substrate. The process described herein can allow the usage of different III-V material at emitter, base, and collector. The methods and structures of the present disclosure are now described with greater detail with reference to FIGS. 1-18.

FIG. 1 depicts one embodiment of a semiconductor on insulator (SOI) layer substrate 1. The semiconductor on insulator layer substrate 1 may include at least a first semiconductor layer 4 (also referred to as a semiconductor on insulator (SOI) layer) overlying a dielectric layer 3 (also referred to as buried oxide (BOX) layer, in which a base semiconductor layer 2 may be present underlying the dielectric layer 3. The semiconductor material that provides the semiconductor on insulator layer 4 may be a type IV semiconducting material including, but not limited to Si, strained Si, SiC, SiGe, SiGeC, Si alloys, Ge, Ge alloys or any combination thereof. In one example, the semiconductor on insulator layer 4 is composed of silicon. The semiconductor on insulator layer 4 can have a thickness ranging from 5.0 nm to 15.0 nm. In another example, the semiconductor on insulator layer 4 has a thickness ranging from 7.5 nm to 12.5 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The base semiconductor layer 2 may have the same or a different composition than the semiconductor on insulator layer 4.

The dielectric layer 3 that may be present underlying the semiconductor on insulator layer 4 and atop the base semiconductor layer 2 may be formed by implanting a high-energy dopant into a bulk semiconductor substrate and then annealing the structure to form a buried insulating layer, i.e., dielectric layer 3. In another embodiment, the dielectric layer 3 may be deposited or grown prior to the formation of the semiconductor on insulator layer 4. In yet another embodiment, the semiconductor on insulator substrate 1 may be formed using wafer-bonding techniques, where a bonded wafer pair is formed utilizing glue, adhesive polymer, or direct bonding.

Figure 2:
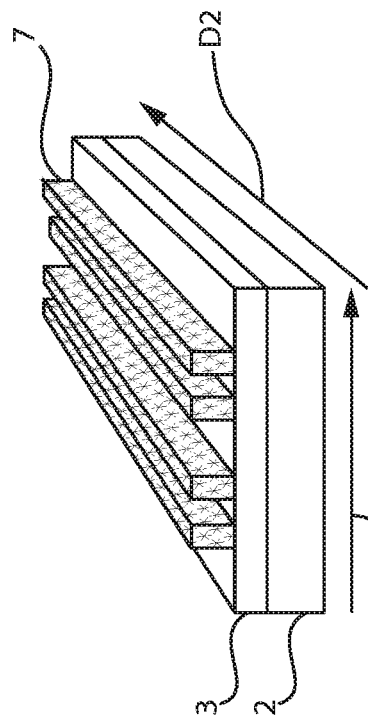
FIG. 2 is a perspective view depicting one embodiment of first patterning a fin structure from a type IV semiconductor on insulator layer that is present over a buried dielectric layer, the buried dielectric layer is present on a type IV base substrate layer, wherein a first mask for patterning the fin structure provides fins having a length extending in a first direction along a trench.

FIG. 2 depicts one embodiment of first patterning a fin structure 5 from the type IV semiconductor on insulator layer 4 that is present over a buried dielectric layer 3, wherein a first mask for patterning the fin structures 5 provides fins 5 having a length extending in a first direction along a trench. The plurality of fin structures 5 may be formed from the substrate, e.g., semiconductor on insulator substrate 1, using photolithography and etch processes. Prior to etching the semiconductor on insulator substrate 1 to provide the plurality of fin structures 15, a layer of the dielectric material is deposited atop the semiconductor on insulator substrate 1 to provide a dielectric fin cap 6. The material layer that provides the dielectric fin cap 6 may be composed of a nitride, oxide, oxynitride material, and/or any other suitable dielectric layer. The dielectric fin cap 6 may comprise a single layer of dielectric material or multiple layers of dielectric materials. The material layer that provides the dielectric fin cap 6 can be formed by a deposition process, such as chemical vapor deposition and/or atomic layer deposition. Alternatively, the material layer that provides the dielectric fin cap 6 may be formed using a growth process, such as thermal oxidation or thermal nitridation. The material layer that provides the dielectric fin cap 6 may have a thickness ranging from 1 nm to 100 nm. In one example, the dielectric fin cap 6 is composed of an oxide, such as $SiO_2$, that is formed by chemical vapor deposition to a thickness ranging from 25 nm to 50 nm. In one embodiment, no dielectric fin cap is present.

In one embodiment, following the formation of the layer of dielectric material that provides the dielectric fin cap 6, a photolithography and etch process sequence is applied to the material layer for the dielectric fin cap 6 and the semiconductor on insulator substrate 1. Specifically, in one example, a photoresist mask is formed overlying the layer of the dielectric material that provides dielectric fin cap and is present overlying the semiconductor on insulator layer 4 of the semiconductor on insulator substrate 1, in which the portion of the dielectric material that is underlying the photoresist mask provides the dielectric fin cap 6, and the portion of the semiconductor on insulator layer 4 that is underlying the photoresist mask provides the plurality of fin structures 5. The exposed portions of the dielectric material that provides dielectric fin cap 6 and the semiconductor on insulator layer 4, which are not protected by the photoresist mask, are removed using a selective etch process. To provide the photoresist mask, a photoresist layer is first positioned on the layer of the dielectric material that provides dielectric fin cap 6. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the dielectric material that provides the dielectric fin cap 6 followed by removing the unprotected portion of the semiconductor on insulator layer 4 selective to the underlying dielectric layer 3. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Figure 3:
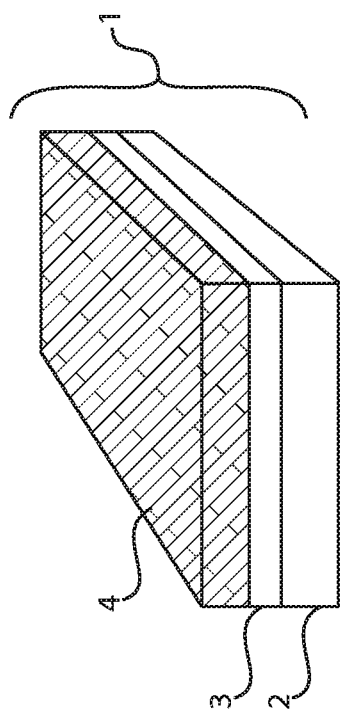
FIG. 3 is a perspective view depicting forming a first type III-V semiconductor material layer on sidewalls of the fin structure from the type IV semiconductor on insulator layer.

FIG. 3 is a perspective view depicting forming a first type III-V semiconductor material layer 6 on sidewalls of the fin structure 5 from the type IV semiconductor on insulator layer. The first type III-V semiconductor material layer 6 provides the base region of the device. The first type III-V semiconductor material layer 6 can be formed using an epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially close or the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

A number of different sources may be used for the deposition of epitaxial type III-V semiconductor material for the first type III-V semiconductor material layer 6 that provides the base region of the device. In some embodiments, the sources for epitaxial growth of type III-V semiconductor material include liquid or solid sources containing In, Al, As, Ga, N, P elements and combinations thereof and/or a gas precursor selected from the group consisting of Trimethylaluminum $(CH_3)_3Al$, Trimethylgallium $(CH_3)_3Ga$, (TMG), Trimethylindium (TMI) $(CH_3)_3IN$, tertiary-butylphosphine (TBP), tertiary-butylarsine (TBA), phosphine ($PH_3$), arsine ($AsH_3$) ammonia ($NH_3$), and combinations thereof. The temperature for epitaxial deposition of type III-V semiconductor materials typically ranges from 350° C. to 700° C.

The III-V semiconductor material that provides the first type III-V semiconductor material layer 7 may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The first type III-V semiconductor material layer 7 for the base region is doped to an n-type or p-type conductivity. The III-V semiconductor material layer 7 for the base region may be in situ doped. The term "in situ" denotes that the dopant that dictates the conductivity type of a material is introduced while the material is being formed, e.g., during the epitaxial growth process. The term "p-type" refers to the addition of impurities to an intrinsic semiconductor that creates deficiencies of valence electrons. As used herein, "n-type" refers to the addition of impurities that contributes free electrons to an intrinsic semiconductor. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, the dopants that dictate the n-type or p-type conductivity may include silicon (Si), iron (Fe), germanium (Ge) and combinations thereof.

Figure 4:
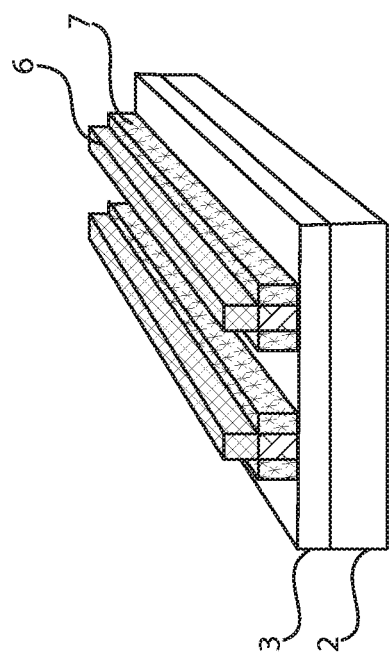
FIG. 4 is a perspective view depicting removing the fin structure that was formed from the type IV semiconductor on insulator layer.

FIG. 4 depicts removing the fin structure 5 that was formed from the type IV semiconductor on insulator layer. The fin structures 5, as well as the dielectric fin cap 6, may be removed from the structure using an etch that is selective to the dielectric layer 3 of the SOI substrate. FIG. 4 illustrates two directions, i.e., an across the trench direction D1, and an along the trench direction D2. The across the trench D1 direction is across the length of the first type III-V semiconductor material layer 6, which is also across the space separating adjacent portions of the first type III-V semiconductor material layer 6, which can be referred to as trenches. Perpendicular to the across the trench D1 direction, is the along the trench D2 direction.

Figure 5:
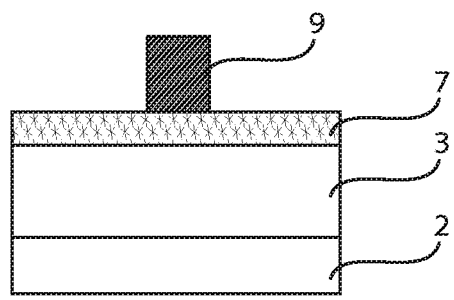
FIG. 5 is a side cross-sectional view depicting forming a dummy base region on the first type III-V semiconductor material.
Figure 6:
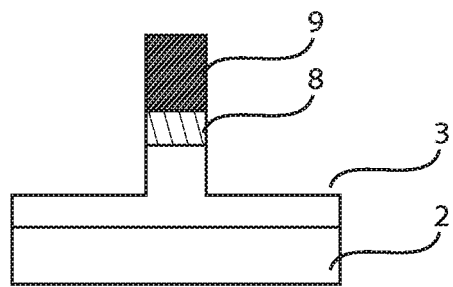
FIG. 6 is a side cross-sectional view depicting one embodiment of patterning the first type III-V semiconductor material layer into a base region atop a pedestal of the buried dielectric layer, wherein a second mask for patterning the base region extends along a second direction that is perpendicular to the first direction and is across the trench.

FIGS. 5 and 6 depict patterning the first type III-V semiconductor material layer 7 to provide the base region 8. The base region 8 may be patterned using a dummy extrinsic base region 9, which functions as an etch mask, as depicted in FIG. 5. In some embodiments, the dummy extrinsic base region 9 may be composed of a dielectric material, such as a nitride, e.g., silicon nitride, or an oxide, such as silicon oxide, that can be removed selectively to the first type III-V semiconductor material layer 7. FIG. 6 depicts one embodiment of patterning the first type III-V semiconductor material layer 7 into a base region 8 atop a pedestal of the buried dielectric layer 3. During this process step, a second mask (provided by the dummy extrinsic base region 9) for patterning the base region 8 extends along a direction D1 (across the trench) that is perpendicular to the first direction that is parallel to the length of the first type III-V semiconductor material layer 7, and is across the trench. The etch process for patterning the first type III-V semiconductor material layer 7 into a base region 8 may be an anisotropic etch, such as reactive ion etching, and may also remove material from the dielectric layer 3 of the SOI substrate 1. This provides that a pedestal portion of the dielectric layer 3 is aligned with the base region 8.

Figure 7:
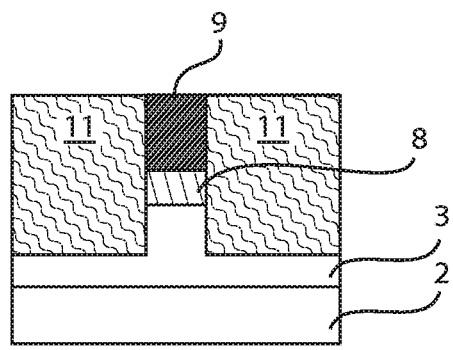
FIG. 7 is a side cross-sectional view forming a layer of dielectric spacer material on opposing sides of the base region, in accordance with one embodiment of the present disclosure.

FIG. 7 depicts one embodiment of forming a layer of dielectric spacer material 11 on opposing sides of the base region 8, and on the recessed portions of the dielectric layer 3 on opposite sides of the pedestal that is underlying the base region 8. In some embodiments, the layer of dielectric spacer material 11 may be composed of a dielectric material, such as a nitride, e.g., silicon nitride, or an oxide, such as silicon oxide. The layer of dielectric spacer material 11 may be deposited using a chemical vapor deposition process, such as plasma enhanced chemical vapor deposition (PECVD). To provide that the upper surface of the dielectric spacer material 11 is coplanar with the upper surface of the dummy extrinsic base region 9 a planarization process, such as chemical mechanical planarization (CMP), may follow the deposition process that forms the dielectric spacer material 11.

Figure 8:
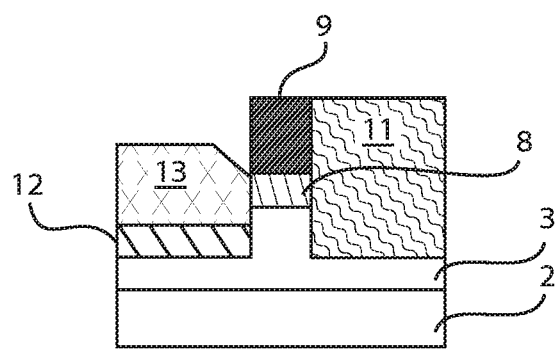
FIG. 8 is a side cross-sectional view depicting one embodiment of forming a first block mask over the collector side of the device depicting in FIG. 7, recessing the layer of dielectric spacer material on an emitter side of the base region to form an emitter spacer; and epitaxially growing a first portion of the at least said second type III-V semiconductor material on an emitter sidewall of the base region to form the emitter region.

FIG. 8 depicts one embodiment of forming a first block mask (not shown) over the collector side of the device depicting in FIG. 7, recessing the layer of dielectric spacer material 11 on an emitter side of the base region 8 to form an emitter spacer 12; and epitaxially growing a first portion of the at least said second type III-V semiconductor material on an emitter sidewall of the base region 8 to form the emitter region 13.

The first block mask may be a photoresist mask or a hard mask that is patterned using photolithography. The etch process for recessing the layer of dielectric spacer material 11 to provide the emitter spacer 12 may be provided by reactive ion etching (RIE). Recessing the layer of dielectric spacer material 11 exposes a sidewall of the base region 8, which provides a semiconductor surface for epitaxial growth of the emitter region 13. Epitaxial deposition is a selective growth process. Epitaxially deposited material can only be formed on semiconductor surfaces, such as the exposed emitter sidewall of the base region 8. Epitaxially deposited material will not be formed on dielectric surfaces, such as the emitter spacer 12, the dummy extrinsic base region 9 and the first block mask.

The type III-V semiconductor material for the emitter region 13 may have the same or different base composition as the type III-V semiconductor material that is employed in the base region 8. For example, the III-V semiconductor material that provides the first portion of the second type III-V semiconductor material layer for the emitter region 13 may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The conductivity type of the emitter region 13 is an opposite conductivity type as the base region 8. For example, if the base region 8 is doped to an n-type conductivity type, the emitter region 13 is doped to a p-type conductivity type. In another example, if the base region 8 is doped to a p-type conductivity type, the emitter region 13 is doped to an n-type conductivity type. The epitaxial deposition process, and in situ doping process, employed for forming the emitter region 13 is similar to the epitaxial deposition process, and in situ doping process, employed for forming the base region 8. Therefore, the above descriptions of epitaxial growth and in situ doping for type III-V semiconductor materials provided above for forming the material layer of the base region 8 can provide at least one example of the epitaxial deposition process and in situ doping process for forming the emitter region 13.

Figure 9:
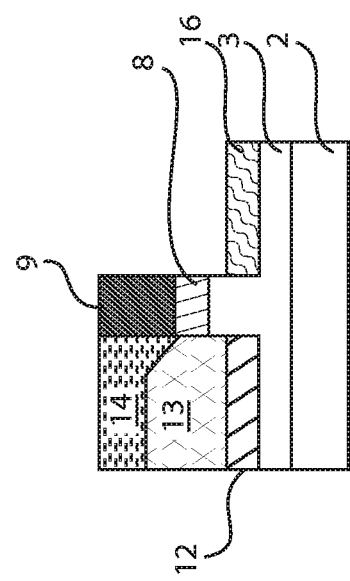
FIG. 9 is a side cross-sectional view of removing the first block mask from the structure depicted in FIG. 8, forming a second block mask over the emitter side of the device depicting in FIG. 8, and recessing the layer of dielectric spacer material on an collector side of the base region to form a collector spacer.

FIG. 9 depicts one embodiment of removing the first block mask from the structure depicted in FIG. 8, forming a second block mask 14 over the emitter side of the device depicting in FIG. 8, and recessing the layer of dielectric spacer material on an collector side of the base region to form a collector spacer 16. The first block mask may be removed by a chemical strip, selective etching and/or oxygen ashing.

The second block mask 14 may be a photoresist mask or a hard mask that is patterned using photolithography. The etch process for recessing the layer of dielectric spacer material 11 to provide the collector spacer 16 may be provided by reactive ion etching (RIE). Recessing the layer of dielectric spacer material 11 exposes a sidewall of the base region 8, which provides a semiconductor surface for epitaxial growth of the collector region 15.

Figure 10:
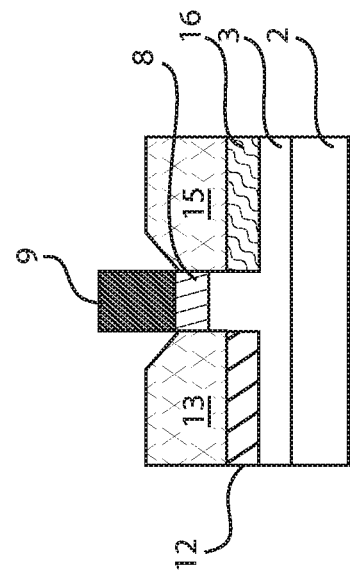
FIG. 10 is a side cross-sectional view depicting one embodiment of epitaxially growing a second portion of the at least said second type III-V semiconductor material on an collector sidewall of the base region to form the collector region.

FIG. 10 depicts one embodiment of epitaxially growing a second portion of the at least said second type III-V semiconductor material on an collector sidewall of the base region 8 to form the collector region 15. Epitaxial deposition is a selective growth process. Epitaxially deposited material can only be formed on semiconductor surfaces, such as the exposed emitter sidewall of the base region 8. Epitaxially deposited material will not be formed on dielectric surfaces, such as the collector spacer 16, the dummy extrinsic base region 9 and the second block mask 14.

The type III-V semiconductor material for the collector region 15 may have the same or different base composition as the type III-V semiconductor material that is employed in the base region 8. The type III-V semiconductor material for the collector region 15 may have the same or different base composition as the type III-V semiconductor material that is employed in the emitter region 13. For example, the III-V semiconductor material that provides the second portion of the second type III-V semiconductor material layer for the collector region 15 may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The conductivity type of the collector region 15 is an opposite conductivity type as the base region 8, and is the same conductivity type as the emitter region 13. For example, if the base region 8 is doped to an n-type conductivity type, the collector region 15 and the emitter region 13 are doped to a p-type conductivity type. In another example, if the base region 8 is doped to a p-type conductivity type, the collector region 15 and the emitter region 13 are doped to an n-type conductivity type. The epitaxial deposition process, and in situ doping process, employed for forming the collector region 15 is similar to the epitaxial deposition process, and in situ doping process, employed for forming the base region 8. Therefore, the above descriptions of epitaxial growth and in situ doping for type III-V semiconductor materials provided above for forming the material layer of the base region 8 can provide at least one example of the epitaxial deposition process and in situ doping process for forming the collector region 15.

Figure 11:
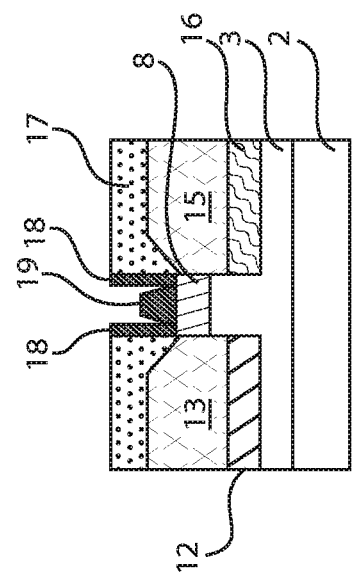
FIG. 11 is a side cross-sectional view depicting forming an extrinsic base region on the base region of the device depicted in FIG. 10.

FIG. 11 depicts forming an extrinsic base region 19 on the base region 8 of the device depicted in FIG. 10. Forming the extrinsic base region 19 may begin with forming an interlevel dielectric layer 17. The interlevel dielectric layer 17 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer 17 include any of the aforementioned materials in porous form, or in a form that changes during processing to or from being porous and/or permeable to being non-porous and/or non-permeable. The interlevel dielectric layer 17 may be deposited using chemical vapor deposition or other deposition processes, such as spin on deposition. A planarization process, such as chemical mechanical planarization (CMP) may be employed to provide that the upper surface of the interlevel dielectric layer 17 is coplanar with the upper surface of the dummy extrinsic base region 9.

In a following process step, the dummy extrinsic base region 9 is removed and spacers 18 are formed on the sidewalls of the interlevel dielectric layer 17 that are exposed by removing the dummy extrinsic base region 9. The dummy extrinsic base region 9 can be removed by an etch process that is selective to the base region 9. Thereafter, the spacers 18 are formed by a conformal deposition process followed by an etch back step. The spacers 18 may be conformally deposited by a chemical vapor deposition process, such as plasma enhanced chemical vapor deposition (PECVD). The spacers 18 may be composed of a dielectric, such as a nitride, e.g., silicon nitride. Following deposition, the conformal material layer can be etched with a directional etch, such as reactive ion etch, which removes the horizontally orientated portions, such as the portion of the conformal material layer that is present on the upper surface of the base region 9. The vertically orientated portions of the conformal dielectric layer remain to provide the spacers 18.

The exposed upper surface of the base region 9 provides a semiconductor surface for epitaxial growth. The extrinsic base region 19 may be composed of a type III-V semiconductor material. The base composition of the extrinsic base region 19 may be the same as at least one of the base region 9, the emitter region 13 and the collector region 15. In some embodiments, the base composition of the extrinsic base region 19 may be the different from at least one of the base region 9, the emitter region 13 and the collector region 15. For example, the III-V semiconductor material that provides the type III-V semiconductor material for the extrinsic base region 19 may be composed of at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The extrinsic base region 19 is doped to a same conductivity type as the base region 8, but the dopant concentration that provides the conductivity type of the extrinsic base region 19 is greater than the dopant concentration that provides the conductivity type of the base region 8. For example, if the base region 9 has an n-type conductivity, the extrinsic base region 19 also has an n-type conductivity. For example, if the base region 9 has a p-type conductivity, the extrinsic base region 19 also has a p-type conductivity. The epitaxial deposition process, and in situ doping process, employed for forming the extrinsic base region 19 is similar to the epitaxial deposition process, and in situ doping process, employed for forming the base region 8. Therefore, the above descriptions of epitaxial growth and in situ doping for type III-V semiconductor materials provided above for forming the material layer of the base region 8 can provide at least one example of the epitaxial deposition process and in situ doping process for forming the extrinsic base region 19.

Following the formation of the extrinsic base region 19, contacts 20, 21, 22 are formed to each of the extrinsic base region 19, the emitter region 13 and the collector region 15. The contacts 20, 21, 22 may be composed of a metal, such as copper, aluminum, tungsten, titanium, tantalum, platinum, gold, silver, and metal nitrides, as depicted in FIG. 12.

Figure 12:
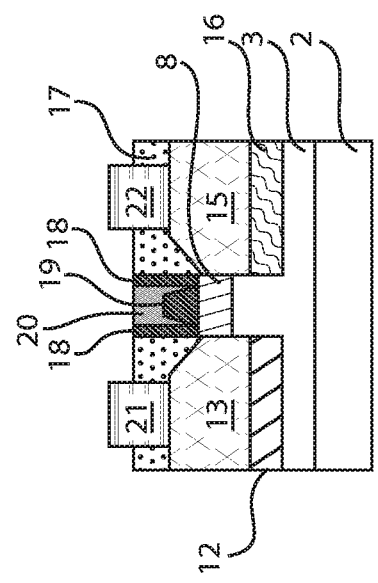
FIG. 12 is a side cross-sectional view of a lateral bipolar junction transistor formed in accordance with the process flow depicted in FIGS. 1-11.

FIG. 12 depicts a lateral bipolar junction transistor 100 that can be formed in accordance with the process flow depicted in FIGS. 1-11. In one embodiment, the lateral bipolar junction transistor (LBJT) transistor 100 (not labeled in FIG. 12) includes an emitter region 13, base region 8 and collector region 15 laterally orientated over a type IV semiconductor substrate 2, each of the emitter region 13, the base region 8 and the collector region 15 being composed of a type III-V semiconductor material; and a buried oxide layer 3 is present between the type IV semiconductor substrate 2 and the emitter region 13, the base region 8 and the collector region 15, the buried oxide layer 3 having a pedestal aligned with the base region 8. The emitter region 13, the base region 8 and the collector region 15 are each comprised of a different base material for the type III-V semiconductor material. The type IV semiconductor substrate 2 may be a silicon containing substrate, e.g., single crystal silicon (Si) having orientation (100). The buried oxide layer 3 is comprised of a silicon oxide containing dielectric layer, e.g., silicon oxide ($SiO_2$).

Figure 13:
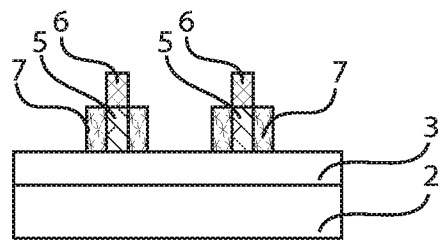
FIG. 13 is a side cross-sectional view of another embodiment of first patterning a fin structure from a type IV semiconductor on insulator layer that is present over a buried dielectric layer, and forming a first type III-V semiconductor material layer on sidewalls of the fin structure from the type IV semiconductor on insulator layer.

FIG. 13 depicts another embodiment of first patterning a fin structure 5 from a type IV semiconductor on insulator layer 4 that is present over a buried dielectric layer 3, and forming a first type III-V semiconductor material layer 8 on sidewalls of the fin structure from the type IV semiconductor on insulator layer 4. The SOI substrate 1 that is processed to provide the fin structure 5 from a type IV semiconductor on insulator layer 4 has been described above with reference to FIG. 1. The fin structure 5 that is etched from the SOI substrate 1 using a dielectric fin cap 6 has been described above with reference to FIG. 2. Forming a first type III-V semiconductor material layer 8 on sidewalls of the fin structure 5 from the type IV semiconductor on insulator layer 4 has been described above with reference to FIG. 3. The first type III-V semiconductor material layer 8 provides a base region of a lateral bipolar junction transistor (LBJT).

Figure 14:
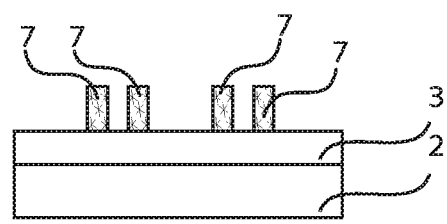
FIG. 14 is a side cross-sectional view depicting removing the fin structure that was formed from the type IV semiconductor on insulator layer that is depicted in FIG. 13.

FIG. 14 depicts removing the fin structure 5 that was formed from the type IV semiconductor on insulator layer that is depicted in FIG. 13. Removing the fin structure 5 has been described with reference to FIG. 4.

Figure 15:
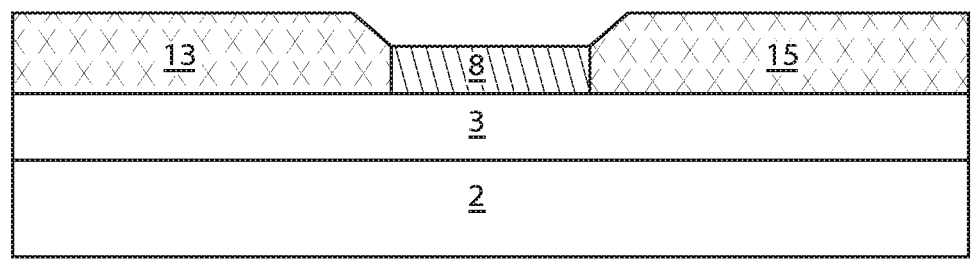
FIG. 15 is a side cross-sectional view of a lateral bipolar junction transistor formed in accordance with the process flow depicted in FIGS. 13-14.

In a following process step, an emitter region 13 and a collector region 15 may be formed on the sidewalls of the first type III-V semiconductor material layer 8, as depicted in FIG. 15. The emitter region 13 and collector region 15 may be composed of a second type III-V semiconductor material layer that may be the same or different from the first type III-V semiconductor material layer 8. The emitter region 13 and collector region 15 may be formed using epitaxial growth and in situ doping as described above with reference to FIGS. 8, 9 and 10.

Figure 16:
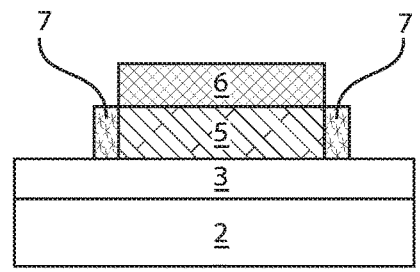
FIG. 16 is a side cross-sectional view of another embodiment of first patterning a fin structure from a type IV semiconductor on insulator layer that is present over a buried dielectric layer, and forming a first type III-V semiconductor material layer on sidewalls of the fin structure from the type IV semiconductor on insulator layer.

FIG. 16 depicts another embodiment of first patterning a fin structure 5 from a type IV semiconductor on insulator layer 4 that is present over a buried dielectric layer 3 of an SOI substrate 1, and forming a first type III-V semiconductor material layer on sidewalls of the fin structure from the type IV semiconductor on insulator layer. The fin structure is formed of type IV semiconductor material is wider in the embodiment depicted in FIG. 16 than the fin structures that are employed in the methods and structures that have been described with reference to FIGS. 1-15.

Figure 17:
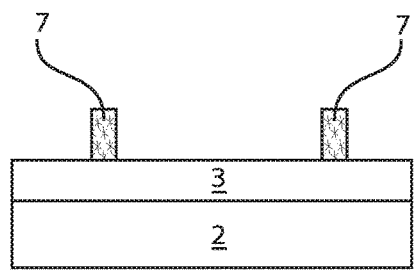
FIG. 17 is a side cross-sectional view depicting removing the fin structure that was formed from the type IV semiconductor on insulator layer that is depicted in FIG. 26.

FIG. 17 is a side cross-sectional view depicting removing the fin structure that was formed from the type IV semiconductor on insulator layer that is depicted in FIG. 16. Removing the fin structure 5 has been described with reference to FIG. 4.

Figure 18:
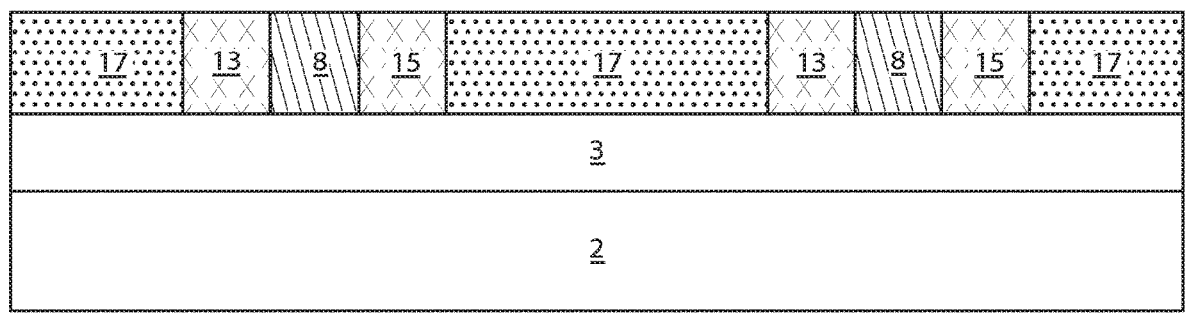
FIG. 18 is a side cross-sectional view of a lateral bipolar junction transistor formed in accordance with the process flow depicted in FIGS. 16-17.

FIG. 18 depicts a lateral bipolar junction transistor formed in accordance with the process flow depicted in FIGS. 16-17. An emitter region 13 and a collector region 15 may be formed on the sidewalls of the first type III-V semiconductor material layer 8 that is depicted in FIG. 17. The emitter region 13 and collector region 15 may be composed of a second type III-V semiconductor material layer that may be the same or different from the first type III-V semiconductor material layer 8. The emitter region 13 and collector region 15 may be formed using epitaxial growth and in situ doping as described above with reference to FIGS. 8, 9 and 10.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of direct growth of lateral III-V bipolar transistor on silicon substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A lateral bipolar junction transistor (LBJT) device comprising:

an emitter region, base region and collector region laterally orientated over a base semiconductor layer of type IV semiconductor for an SOI substrate, each of the emitter region, the base region and the collector region being composed of a type III-V semiconductor material, the emitter region and the collector region each having a sloped upper surface portion extending laterally from an outer edge of the base region to a height greater than an upper surface of the base region, wherein the emitter region, the base region and the collector region are each comprised of a different base material for said type III-V semiconductor material, the emitter and collector being epitaxial materials having a crystalline characteristics substantially matching the base region;

a buried oxide layer of the SOI substrate is present between and in direct contact with the of the base semiconductor layer of the type IV semiconductor for the SOI substrate and the emitter region, the base region and the collector region, the buried oxide layer having a pedestal aligned with the base region, wherein a lower surface of the base region is vertically offset from a lower surface of at least one of the emitter region and the collector region, wherein an epitaxial relationship is not present between either of the emitter region and the collector region and the buried oxide layer that emitter region and collector region are in direct contact with; and a spacer dielectric layer present between the buried oxide layer and the emitter region and the collector region, the spacer dielectric layer having a separate composition than the buried oxide layer.

2. The LBJT of claim 1, wherein the type IV semiconductor substrate is a silicon containing substrate.

3. The LBJT of claim 1, wherein the buried oxide layer is comprised of a silicon oxide containing dielectric layer.

4. The LBJT of claim 1, wherein an extrinsic base region is present on the base region.

5. The LBJT of claim 1, wherein the extrinsic base region is doped to a first conductivity type and the emitter and the collector are doped to a second conductivity type.

* * * * *